United States Patent
Bollen et al.

(10) Patent No.: US 9,624,386 B2
(45) Date of Patent: Apr. 18, 2017

(54) METHOD TO PREPARE A METALLIC NANOPARTICLE DISPERSION

(71) Applicant: AGFA GEVAERT, Mortsel (BE)

(72) Inventors: Dirk Bollen, Mortsel (BE); Nicolas Vriamont, Mortsel (BE); Jaroslav Katona, Mortsel (BE)

(73) Assignee: AGFA GEVAERT, Mortsel (BE)

( * ) Notice: Subject to any disclaimer, the term of this patent is extended or adjusted under 35 U.S.C. 154(b) by 0 days.

(21) Appl. No.: 14/766,545

(22) PCT Filed: Mar. 18, 2014

(86) PCT No.: PCT/EP2014/055429
§ 371 (c)(1),
(2) Date: Aug. 7, 2015

(87) PCT Pub. No.: WO2014/147079
PCT Pub. Date: Sep. 25, 2014

(65) Prior Publication Data
US 2015/0368483 A1    Dec. 24, 2015

(30) Foreign Application Priority Data
Mar. 20, 2013 (EP) .................................. 13160118

(51) Int. Cl.
| C09D 5/24 | (2006.01) |
| C09D 11/52 | (2014.01) |
| C09D 11/037 | (2014.01) |
| B22F 9/24 | (2006.01) |
| H05K 3/10 | (2006.01) |
| C09D 17/00 | (2006.01) |
| H05K 1/09 | (2006.01) |

(52) U.S. Cl.
CPC ............ *C09D 5/24* (2013.01); *B22F 9/24* (2013.01); *C09D 11/037* (2013.01); *C09D 11/52* (2013.01); *C09D 17/004* (2013.01); *H05K 3/10* (2013.01); *H05K 1/097* (2013.01)

(58) Field of Classification Search
CPC ........ C09D 7/001; C09D 5/24; C09D 11/033; C09D 11/30; C09D 11/52; C09D 17/006; C09D 17/007
See application file for complete search history.

(56) References Cited

U.S. PATENT DOCUMENTS

| 7,931,941 B1 | 4/2011 | Mastropietro et al. | |
| 2007/0098608 A1* | 5/2007 | Tomonari | B01J 13/00 423/22 |
| 2009/0321689 A1 | 12/2009 | Harada et al. | |
| 2010/0084599 A1 | 4/2010 | Lewis et al. | |
| 2010/0090179 A1 | 4/2010 | Mokhtari et al. | |
| 2012/0037041 A1* | 2/2012 | Nolte | B22F 1/0062 106/287.18 |
| 2013/0153835 A1* | 6/2013 | Hinotsu | H01B 1/16 252/514 |

FOREIGN PATENT DOCUMENTS

| EP | 2 468 827 A1 | 6/2012 |
| EP | 2 608 218 A1 | 6/2013 |
| EP | 2 671 927 A1 | 12/2013 |
| EP | 2 608 217 B1 | 7/2014 |
| WO | 2004/085165 A1 | 10/2004 |

OTHER PUBLICATIONS

Official Communication issued in International Patent Application No. PCT/EP2014/055429, mailed on Jun. 23, 2014.

* cited by examiner

*Primary Examiner* — Lan Vinh
*Assistant Examiner* — Bradford Gates
(74) *Attorney, Agent, or Firm* — Keating and Bennett, LLP

(57) ABSTRACT

A method to prepare a metallic nanoparticle dispersion includes the steps of forming a metallic precursor dispersion or solution by adding a metallic precursor to a dispersion medium including:
(a) a solvent according to Formula I, and

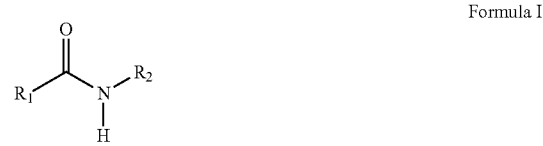

Formula I wherein
$R_1$ and $R_2$ represent an optionally substituted alkyl group,
$R_1$ and $R_2$ may form a ring,
(b) a carboxylic acid according to Formula II,

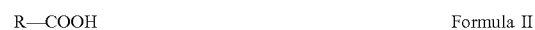

R—COOH                                    Formula II wherein R is an optionally substituted C2-C7 alkyl, alkenyl or alkynyl group,
reducing the metallic precursor with a reducing agent to form metallic nanoparticles,
sedimenting the metallic nanoparticles to obtain a highly concentrated metallic nanoparticle dispersion comprising at least 15 wt % of metallic nanoparticles.

18 Claims, No Drawings

METHOD TO PREPARE A METALLIC NANOPARTICLE DISPERSION

CROSS-REFERENCE TO RELATED APPLICATIONS

This application is a 371 National Stage Application of PCT/EP2014/055429, filed Mar. 18, 2014. This application claims the benefit of European Application No. 13160118.9, filed Mar. 20, 2013, which is also incorporated by reference herein in its entirety.

BACKGROUND OF THE INVENTION

1. Field of the Invention

The present invention relates to a method of preparing metallic nanoparticle dispersions having a high metallic content and to printing and coating fluids made from these dispersions with which highly conductive patterns or coatings can be formed at moderate curing conditions.

2. Description of the Related Art

The interest in printing or coating fluids containing metallic nanoparticles has increased during the last decades due to the unique properties of such metallic nanoparticles, when compared to the bulk properties of a given metal. For example, the melting point of metallic nanoparticles decreases with decreasing particle size, making them of interest for printed electronics, electrochemical, optical, magnetic and biological applications.

The production of stable and concentrated metallic printing or coating fluids, which can be printed for example by inkjet printing or screen printing, or coated at high speed, is of great interest as it enables the preparation of electronic devices at low costs.

Typically metallic nanoparticles are prepared by the polyol synthesis methodology as disclosed in Mat. Chem. Phys. 114, 549-555, by a derivative of the polyol synthesis methodology or by an in-situ reduction of metallic salts in the presence of various reducing agents. Such methods are disclosed in for example US2010143591, US2009142482, US20060264518 and US20080220155, EP2147733, EP2139007, EP803551, EP2012952, EP2030706, EP1683592, EP166617, EP2119747, EP2087490 and EP2010314, WO2008/151066, WO2006/076603, WO2009/152388 and WO2009/157393.

In such a polyol synthesis, so called capping agents are often used to stabilize the metallic precursor or metallic nanoparticles. Such capping agents usually contain functional groups such as thiol (—SH), carboxyl (—COOH), or amine (—NH) groups. U.S. Pat. No. 8,197,717 for example discloses a metallic ink comprising metallic nanoparticles made by the polyol synthesis wherein the nanoparticles are capped by a capping material such as polyvinylpyrrolidone (PVP).

After applying the metallic printing or coating fluids on a substrate, a sintering step, also referred to as curing step, at elevated temperatures is carried out to induce/enhance the conductivity of the applied patterns of layers. The organic components of the metallic printing or coating fluids, for example polymeric dispersants or capping agents, may reduce the sintering efficiency and thus the conductivity of the applied patterns of layers. For this reason, higher sintering temperatures and longer sintering times are often required to decompose the organic components.

Such high sintering temperatures are not compatible with common polymer foils, such as polyethylene terephthalate (PET) or polycarbonate, which have relatively low glass transition temperatures. There is thus an interest in lowering the sintering temperatures needed to obtain conductive layers or patterns.

EP-A 2468827 discloses polymeric dispersants, which have a 95 wt % decomposition at a temperature below 300° C. as measured by Thermal Gravimetric Analysis. By using metallic printing or coating fluids comprising such polymeric dispersants, the sintering temperature and time could be reduced. In EP-A 11194791.7 and EP-A 11194790.9 both filed on 21-12-2011 a so called sintering additive is used in combination with a polymeric dispersant of EP-A 2468827 to further lower the sintering temperature.

EP-A 12170774.9, filed on 05-06-2012, discloses a metallic nanoparticle dispersion comprising a dispersion medium characterized in that the dispersion medium comprises a specific solvent, for example 2-pyrrolidone. When using such a solvent as dispersion medium, no polymeric dispersants are necessary to obtain stable metallic nanoparticle dispersions.

A disadvantage of metallic nanoparticle dispersions is often their limited content of metallic nanoparticles. To prepare a proper coating or printing fluid, it is therefore often necessary to perform a concentration step on such dispersions. Moreover, storing diluted dispersions may often result in stability issues.

US2010/0084599 discloses the preparation of a silver nanoparticle composition containing a short-chain and a long-chain capping agent adsorbed on the silver particles. The capping agents are both anionic polyelectrolytes having a specific Molecular Weight.

U.S. Pat. No. 7,931,941 discloses a process for the synthesis of metallic nanoparticles by chemical reduction of metal salts in the presence of carboxylic acids including from 3 to 7 carbons capable of binding to the metal particles surfaces and stabilizing them against agglomeration. The synthesis is carried out in water.

US2010/0090179 discloses a process for producing carboxylic acid-stabilized silver nanoparticles wherein silver salt particles are reduced in a solution containing the carboxylic acids.

SUMMARY OF THE INVENTION

Preferred embodiments of the present invention provide a method of preparing concentrated metallic nanoparticle dispersions comprising at least 15 wt % of metallic nanoparticles.

This is realized by the method described below. It has been found that by using a solvent according to Formula I and a monocarboxylic acid according to Formula II as dispersion medium wherein a metal precursor is converted to metallic nanoparticles, a highly concentrated metallic nanoparticles dispersion is obtained with which high conductive pattern or coatings can be prepared at moderate sintering temperatures.

Another preferred embodiment of the invention is to prepare printing and coating fluids from the highly concentrated metallic nanoparticle dispersions, with which highly conductive patterns or coatings can be formed at moderate curing conditions.

This is realized by the method described below. With the printing fluids obtained, metallic patterns or layers can be prepared, for example by screen printing, which have a high conductivity at moderate sintering temperatures.

Further advantages and embodiments of the present invention will become apparent from the following description and the dependent claims.

DETAILED DESCRIPTION OF THE PREFERRED EMBODIMENTS

A method to prepare a metallic nanoparticle dispersion according to a preferred embodiment of the present invention comprises the steps of:

forming a metallic precursor dispersion or solution by adding a metallic precursor to a dispersion medium comprising;
(a) a solvent according to Formula I, and

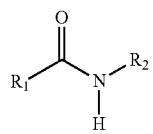

Formula I wherein
$R_1$ and $R_2$ represent an optionally substituted alkyl group, $R_1$ and $R_2$ may form a ring,
(b) a carboxylic acid according to Formula II,

  R—COOH    Formula II wherein
R is an optionally substituted C2-C7 alkyl, alkenyl or alkynyl group,
reducing the metallic precursor with a reducing agent to form metallic nanoparticles;
sedimenting the metallic nanoparticles to obtain a concentrated metallic nanoparticle dispersion comprising at least 15 wt % of metallic nanoparticles.

It has been observed that by using the combination of the solvent according to Formula I and the carboxylic acid according to Formula II, a fine and homogenous sediment of metal nanoparticles can be obtained, which is easily redispersed and with which highly conductive layers may be prepared. A possible explanation may be that both the solvent according to Formula I and the carboxylic acid according to Formula II stabilize the metal precursor particles and/or the metal nanoparticle which may result in the absence of agglomerates of particles. There are indications that the solvent according to Formula I especially stabilizes the metal nanoparticles, while the carboxylic acid stabilizes the metal precursor particles.

Metallic Nanoparticles

The metallic nanoparticles comprise one or more metals in elemental or alloy form. The metal is preferably selected from the group consisting of silver, gold, copper, nickel, cobalt, molybdenum, palladium, platinum, tin, zinc, titanium, chromium, tantalum, tungsten, iron, rhodium, iridium, ruthenium, osmium, aluminium and lead. Metallic nanoparticles based on silver, copper, molybdenum, aluminium, gold, copper, or a combination thereof, are particularly preferred. Most preferred are silver nanoparticles.

The term "nanoparticles" refers to dispersed particles having an average particle size below 200 nm at the end of the dispersion preparation. The metallic nanoparticles have an average particle size at the end of the dispersion preparation of less than 200 nm, preferably less than 100 nm, more preferably less than 50 nm, most preferably less than 30 nm.

Carboxylic Acid

The reaction or dispersion medium contains a carboxylic acid according to Formula II,

 R—COOH    Formula II wherein
R is an optionally substituted C2-C7 alkyl, alkenyl or alkynyl group.

A C2-C7 alkyl, alkenyl or alkynyl group contains between 2 and 7 carbon atoms.

R is preferably an optionally substituted C2-C7 alkyl group. The term "alkyl" means all variants possible for each number of carbon atoms in the alkyl group i.e. for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl etc.

Preferably R is a n-alkyl group. When the chain length of the alkyl group increases an increase of the viscosity of the reaction mixture has been observed. On the other hand, the acids with a shorter alkyl group have an unacceptable smell. The R group in Formula II is most preferably a C4-C6 n-alkyl group.

Particularly preferred carboxylic acids according to Formula II are pentanoic acid, hexanoic acid and heptanoic acid.

The amount of carboxylic acid according to Formula II, expressed as molar ratio of carboxylic acid to metal is preferably between 1 and 10, more preferably between 2 and 8, most preferably between 3 and 6.

Solvent

The dispersion medium contains a solvent according to Formula I,

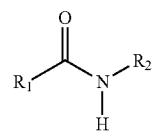

Formula I wherein
$R_1$ and $R_2$ represent an optionally substituted alkyl group, and
$R_1$ and $R_2$ may form a ring, In a preferred embodiment the dispersion medium comprises a solvent according to Formula III,

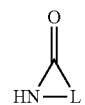

Formula III wherein
L is an optionally substituted linear or branched $C_2$-$C_{11}$ alkylene group.

In a more preferred embodiment the reaction medium comprises a solvent selected from an optionally substituted 2-pyrrolidone, β-lactam, γ-lactam, δ-lactam, or ε-lactam.

In an even more preferred embodiment the reaction medium comprises a solvent selected from 2-pyrrolidone, 4-hydroxy-2-pyrrolidone, δ-valerolactam or ε-caprolactam.

In a most preferred embodiment the reaction medium comprises 2-pyrrolidone.

The amount of solvent, expressed as molar ratio of the solvent to metal is preferably between 1 and 20, more preferably between 2 and 15, most preferably between 3 and 10.

Co-Solvent

The dispersion medium of the metallic nanoparticle dispersion may comprise, in addition to the solvent according to Formula I, a co-solvent, preferably an alcohol or a ketone. The co-solvent is more preferably ethanol or methylethyl ketone (MEK). The co-solvent may be present from the start of the preparation of the metallic nanoparticle dispersion or may be added during or at the end of the preparation.

The amount of co-solvent is preferably ≤75 wt %, more preferably ≤50 wt %, most preferably ≤25 wt %, relative to the amount of solvent according to Formula I.

Polymeric Dispersant

The dispersion medium may contain a dispersant, typically a polymeric dispersant. However, as such polymeric dispersants (or other additives) may lower the conductivity of the coatings prepared with the metallic nanoparticle dispersion at low sintering temperatures, it is preferred not to use them.

Polymeric dispersants are typically homo- or copolymers prepared from acrylic acid, methacrylic acid, vinyl pyrrolidinone, vinyl butyral, vinyl acetate or vinyl alcohol monomers.

The polymeric dispersants disclosed in EP-A 2468827 having a 95 wt % decomposition at a temperature below 300° C. as measured by Thermal Gravimetric Analysis may also be used.

However, in a preferred embodiment the metallic nanoparticle dispersion comprises less than 5 wt % of a polymeric dispersant relative to the total weight of the dispersion, more preferably less than 1 wt %, most preferably less than 0.1 wt %. In a particularly preferred embodiment the dispersion comprises no polymeric dispersant at all.

Metallic Precursor Dispersion

The metal precursor dispersion is prepared by adding the metal precursor to the dispersion medium, containing the solvent according to Formula I and the carboxylic acid according to Formula II.

The metallic precursor particles are typically available as powders, flakes, particles or aggregated particles. Prior to the dispersion preparation the flakes or powders may be down-sized by dry milling, wet-milling, high shear dispersion methods or sieving techniques.

The metal precursor dispersion may also be prepared by adding the metal precursor to a dispersion medium containing the carboxylic acid according to Formula II. The solvent according to Formula I may then be added at a later stage, during or after the reduction step.

The temperature of dispersion is preferably room temperature. However, dependent on the solubility of the carboxylic acid in the solvent, higher temperatures may be used.

To prepare the metallic precursor dispersion typical dispersion methods such as precipitation, mixing, milling, in-situ synthesis or a combination thereof may used. The experimental conditions such as temperature, process time, energy input, etc. depend on the methodology chosen. The dispersion process can be carried out in a continuous, batch or semi-batch mode.

Mixing apparatuses may include a pressure kneader, an open kneader, a planetary mixer, a dissolver, a high shear stand mixer, and a Dalton Universal Mixer. Suitable milling and dispersion apparatuses are a ball mill, a pearl mill, a colloid mill, a high-speed disperser, double rollers, a bead mill, a paint conditioner, and triple rollers. Many different types of materials may be used as milling media, such as glasses, ceramics, metals, and plastics. The dispersions may also be prepared using ultrasonic energy.

The concentration of the dispersion, expressed in wt % metal, is preferably between 1 and 50 wt %, more preferably between 2 and 25 wt %, most preferably between 3 and 15 wt %.

Reduction Step

The metallic nanoparticles are prepared from metal precursor particles by means of a reduction step, for example the reduction of metal oxides to metals.

Metal precursor particles may be selected from the group consisting of metal oxides, metal salts and metal hydroxides.

Preferred metal oxide particles are silver oxide, tin oxide, titanium oxide, zirconium oxide, wolfram oxide, molybdenum oxide, cadmium oxide, copper oxide or zinc oxide particles.

Also doped metal oxide particles such as ZnO:Al, $SnO_2$:F or $SnO_2$:Sb particles may be used.

Preferred metal hydroxide particles are copper hydroxide, titanium hydroxide, zirconium hydroxide, wolfram hydroxide, molybdenum hydroxide, cadmium hydroxide or zinc hydroxide particles.

Preferred metal salts include inorganic acid salts, such as nitrates, carbonates, chlorides, phosphates, borates, sulfonates and sulfates, and organic acid salts, such as stearate, myristate or acetate.

As mentioned above, particularly preferred metallic nanoparticles are silver nanoparticles. These may be prepared, for example, by the reduction of silver oxide, silver nitrate or silver acetate.

The reducing agents used in this reduction step are preferably soluble in the dispersion medium. The reducing agents may be selected from the group consisting of hydroxylamine and derivatives thereof, formic acid, oxalic acid, ascorbic acid, hydrazine and derivatives thereof, dithiothreitol, phosphites, hydrophosphites, phosphorous acid and derivatives thereof, lithium aluminum hydride, diisobutylaluminum hydride, sodium borohydride, sulfites, tin(II) complexes, iron(II) complexes, zinc mercury amalgam, sodium amalgam, atomic hydrogen, or Lindlar catalyst.

It has been observed that a homogeneous sediment of metallic nanoparticles, which may be easily redispersed, are obtained with reducing agents that are not too reactive.

Preferred reducing agents are hydroxylamine of derivatives thereof, N,N-diethylhydroxylamine being particularly preferred.

The amount of reducing agent used, expressed as molar ratio of the reducing agent to metal is preferably between 1 and 10, more preferably between 2 and 8, most preferably between 3 and 6.

The reduction is typically carried out at room temperature. As the reduction is typically an exothermic process, cooling is necessary to keep the temperature of the dispersion constant. As mentioned above, dependent on the solubility of the carboxylic acid in the solvent, higher temperatures may be used.

The degree of reduction of the metal precursor to metallic nanoparticles is preferably between 60 and 100%.

The reducing agent is preferably added to the dispersion in a controlled way, so as to prevent a too fast reduction of the precursor.

Sedimentation

To realize a highly concentrated metallic nanoparticle dispersion comprising at least 15 wt % of metallic nanoparticles, a sedimentation step is carried out after the reduction step.

After the sedimentation step, a fine, homogeneous sediment of metallic nanoparticles is obtained. The sedimentation step, and the optional washing steps, also results in the removal of organic ingredients (solvent, carboxylic acid, reducing agent, binder) that may have a negative influence on the conductivity of coatings from the dispersions.

Preferably, after the reduction step the dispersion is transferred to a sedimentation vessel containing a stirrer and a tube to remove the supernatant. However, other methods to separate the sediment from the supernatant may also be used.

Sedimentation is preferably carried out by allowing the mixture to stand without stirring for some time, for example overnight.

Sedimentation may however be induced or accelerated by solvent evaporation, by adding a non-solvent, by centrifugation or by ultracentrifugation.

When sedimentation is complete, the supernatant is removed from the sediment. It is very important no to disturb the sediment during the separation of the supernatant from the sediment.

Washing Steps

Preferably, one or more washing steps are carried out on the sediment obtained, to further remove, at least partially, unwanted ingredients still present in the sediment.

In a washing step, a solvent is added to the sediment and the resulting dispersion is stirred for some time, for example one hour or half an hour.

Then, the mixture is allowed to stand without stirring for some time, for example one hour, resulting in a sediment and a supernatant. The supernatant is then removed.

Several washing steps may be carried out, using the same or different solvents.

The solvents are chosen taking into account the removal of unwanted ingredients from the sediment and the sedimentation of the metal nanoparticles in that solvent. Reversible agglomeration of the metal nanoparticles may accelerate the sedimentation. It has been observed that metal nanoparticles prepared by a method of the present invention, i.e. in the presence of the solvent of Formula I and the carboxylic acid according to Formula II, are indeed characterized by such a reversible aggregation, thus accelerating the sedimentation but forming easily redispersible sediment.

The solvent used in the last washing step is chosen, also taking the conductivity and the print properties of the printing or coating fluid made from the dispersion into account.

In a preferred embodiment, four washing steps are carried out. The first two washing steps with 1-methoxy-2-propanol, the last two with Butylcellosolve™, a butylglycolether from DOW CHEMICALS.

The highly concentrated metallic nanoparticle dispersion contains at least 15 wt %, more preferably at least 30 wt %, most preferably at least 50 wt % of metallic nanoparticles, relative to the total weight of the dispersion. Particularly preferred, the metallic nanoparticle dispersion contains between 60 and 80 wt % of metallic nanoparticles relative to the total weight of the dispersion.

Printing or Coating Fluid

A metallic printing or coating fluid, also referred to respectively as a metallic ink or a metallic coating solution, is prepared from the metallic nanoparticle dispersion prepared in accordance with a method according to the present invention.

The metallic nanoparticles dispersion may be directly used as a metallic printing or coating fluid. However, to optimize the coating or printing properties, and also depending on the application for which it is used, additives such as reducing agents, wetting/levelling agents, dewetting agents, rheology modifiers, adhesion agents, tackifiers, humectants, jetting agents, curing agents, biocides or antioxidants may be added to the metallic nanoparticle dispersion.

Preferably, the total amount of additives is preferably between 0 and 20 wt %, more preferably between 1 and 15 wt %, and even more preferably between 2 and 10 wt %, relative to the total weight of the metallic printing or coating fluid.

A thickening agent may be added to increase the viscosity of the printing or coating fluid. Preferred thickening agents may be selected from amorphous silica, polyvinylpyrrolidones having different Molecular Weights, and cellulose based thickening agents. A particular preferred thickening agent is hydroxypropylcellulose.

High boiling solvents are preferably added to the ink to prevent drying of the ink during printing. Moreover, such high boiling solvents also have a positive influence on the conductivity of the ink. Preferred high boiling solvents are diethyleneglycol (DEG), 2-butoxyethanol and 1-methoxy-2-propanol.

Also diluents may be added to the metallic dispersions when preparing the metallic printing or coating fluids. The amount of these optional diluents is preferably less than 75 wt %, more preferably less than 60 wt % relative to the total weight of the ink. The diluents may be selected from alcohols, aromatic hydrocarbons, ketones, esters, aliphatic hydrocarbons, higher fatty acids, carbitols, cellosolves, and higher fatty acid esters. Suitable alcohols include methanol, ethanol, propanol, 1-butanol, 1-pentanol, 2-butanol, t-butanol. Suitable aromatic hydrocarbons include toluene, and xylene. Suitable ketones include methyl ethyl ketone, methyl isobutyl ketone, 2,4-pentanedione and hexa-fluoroacetone. Also glycol, glycolethers, N,N-dimethyl-acetamide, N,N-dimethylformamide may be used. It is however preferred to use a solvent according to Formula I, preferably the same solvent used to prepare the metallic nanoparticle dispersion, as diluent.

The preparation of the metallic printing or coating fluids comprises the addition of the optional additives and/or diluents to the metallic nanoparticle dispersion by using a homogenization technique such as stirring, high shear mixing, ultra-sonication, or a combination thereof. The homogenization step can be carried out at elevated temperature up to 100° C.

In a preferred embodiment, the homogenization step is carried out at temperature equal or below 60° C.

In a preferred embodiment, a metallic screen printing ink is prepared. Such a screen printing ink has a viscosity between 5000 and 400000 mPa·s, preferably between 10000 and 100000 mPa·s, more preferably between 20000 and 50000 mPa·s. According to a particularly preferred embodiment, a silver screen printing ink is prepared.

In another preferred embodiment, a metallic flexographic ink is prepared. Such a flexographic ink has a viscosity between 100 and 3000 mPa·s, preferably between 200 and 1000 mPa·s, most preferably between 300 and 500 mPas·s. According to a particularly preferred embodiment, a silver flexographic ink is prepared.

In another preferred embodiment, a metallic inkjet ink is prepared. Such an inkjet ink has a viscosity between 1 and 50 mPa·s, preferably between 5 and 30 mPa·s, more preferably between 7 and 15 mPa·s. According to a particularly preferred embodiment, a silver inkjet ink is prepared.

The viscosities referred to above are measured at a shear rate of 1/s at temperature between 20 and 25° C. (for example with an AR2000 Rheometer from Texas Instruments).

Metallic Layers or Patterns

The thin layers or patterns printed or coated from the metallic printing or coating fluids can be rendered conductive at lower sintering temperatures compared to those obtained with conventional metallic printing or coating fluids. Therefore, conductive thin layers or patterns made from the metallic printing or coating fluids of the present invention can be coated or printed on flexible substrates that can not withstand thermal treatment at high temperature, such as for example PET.

The metallic layers or patters are prepared by a method comprising the steps of applying a printing or coating fluid as defined above on a substrate followed by a drying and/or sintering step, possibly combined in one step.

Multiple metallic layers or patterns, i.e. a stack of patterned or unpatterned layers, may be applied on a substrate. The substrate referred to in the method of preparing the metallic layers or patterns thus also encompass a previously applied metallic layer or pattern.

The metallic layers or patterns may also be realized by inkjet printing or by any conventional printing techniques such as flexography, offset, gravure or screen printing or by any conventional coating technique such as spray coating, blade coating, slot die coating.

After the layers or patterns are applied on the substrate, a sintering step, also referred to as curing step, is carried out. During this sintering step, solvents evaporate and the metallic particles sinter together. Once a continuous percolating network is formed between the metallic particles, the layers or patterns become conductive. Conventional sintering is carried out by applying heat. The sintering temperature and time are dependent on the substrate used and on the composition of the metallic layer or pattern. The sintering step for curing the metallic layers may be performed at a temperature below 250° C., preferably below 200° C., more preferably below 180° C., most preferably below 160° C.

The sintering time is ≤60 minutes, preferably ≤30 minutes and more preferably ≤15 minutes, depending on the selected temperature, substrate and composition of the metallic layers.

However, instead of or in addition to the conventional sintering by applying heat, alternative sintering methods such as exposure to an Argon laser, to microwave radiation, to UV radiation or to low pressure Argon plasma, photonic curing, plasma or plasma enhanced, electron beam or pulse electric current sintering may be used.

The metallic layers allow to use lower curing temperatures than the prior art processes. In consequence it is possible to use polymeric substrates that can not withstand thermal treatment at high temperature, such as for example PET. The curing time may also be substantially reduced leading to the possibility of having higher production per hour than the prior art processes. The conductivity of the metallic layers are maintained or even improved in certain cases.

The conductivity of the metallic layers or patters, after curing and expressed as % of the bulk conductivity (of the metal) is ≥10, preferably ≥20%, more preferably ≥30%.

The metallic layers or patterns may be used in various electronic devices or parts of such electronic devices as for example organic photo-voltaics (OPV's), inorganic photo-voltaics (c-Si, a-Si, CdTe, CIGS), OLED displays, OLED lighting, inorganic lighting, RFID's, organic transistors, thin film batteries, touch-screens, e-paper, LCD's, plasma, sensors, membrane switches or electromagnetic shielding.

EXAMPLES

Materials

All materials used in the following examples were readily available from standard sources such as ALDRICH CHEMICAL Co. (Belgium) and ACROS (Belgium) unless otherwise specified. All materials were used without further purification unless otherwise specified.

Butylcellosolve™ is a butylglycolether from DOW CHEMICALS.

Dowanol PM™ is 1-methoxy-2-propanol from DOW CHEMICALS.

Klucel™ J, is hydroxypropylcellulose from HERCULES.

DAPRO DF 6800, a defoaming agent (polysiloxane containing hydrophobically modified silica) from ELEMENTIS.

Disperbyk®-2025, a wetting additive from BYK Additives & Instruments.

IPA is isopropyl alcohol.

EtOAc is ethylacetate.

AcOH is acetic acid.

THF is tetrahydrofuran.

MEK is methylethylketon.

DMA is N,N-dimethylacetamide.

NMP is N-methyl pyrrolidone.

Silver oxide from UMICORE.

Conductivity Measurements

The metallic dispersions were coated on a PET substrate. The wet coating thickness was 20 μm. After drying during 3 minutes at 120° C., the coating was put in an oven for 30 minutes at 150° C.

The surface resistance (SER) was measured using a four-point collinear probe. The surface or sheet resistance was calculated by the following formula:

$$SER = (\pi/\ln 2)(V/I)$$

wherein

SER is the surface resistance of the layer expressed in Ω/;

π is a mathematical constant, approximately equal to 3.14;

ln 2 is a mathematical constant equal to the natural logarithmic of value 2, approximately equal to 0.693;

V is voltage measured by voltmeter of the four-point probe measurement device;

I is the source current measured by the four-point probe measurement device.

The conductivity, expressed as percentage of the bulk silver conductivity (% bulk silver), was calculated according to the following formula:

$$\text{Conductivity} = 100 \times \sigma/\sigma_{(Ag)} = 100/[SER \cdot h \cdot \sigma_{(Ag)}] \times 10^5$$

wherein

σ is the specific conductivity of the layer expressed in S/cm;

SER is the surface resistance of the layer expressed in Ω/;

h the dry layer thickness expressed in μm; and $\sigma_{(Ag)}$ is the silver specific conductivity, equal to 6.3 $10^5$ S/cm.

Example 1

Preparation of the Silver Pasta SP-01

78.0 g of silver oxide was slowly added, while stirring, to a 1 l reactor containing 275.0 g of pentanoic acid and 401.0 g of 2-pyrrolidone. The temperature of the mixture was kept at 25° C.

After complete addition of the silver oxide, the suspension was stirred overnight at 25° C.

Then, 300.0 g of N,N-diethylhydroxylamine was added in a time span of 1.5 hours to the suspension. The temperature of the reaction mixture was kept at 25° C. When all reducing agent was added, the reaction mixture was kept at 25° C. while stirring for another hour.

The reaction mixture is then fed to a sedimentation vessel, where it was kept overnight, without stirring. The supernatant was carefully removed from the sediment.

The obtained sediment was washed four times, two times with Dowanol PM™ (547 g) and two times with Butylcellosolve™ (547 g). In each washing step, the solvent was added to the sediment and the resulting suspension stirred for 0.5 hour at 300 rpm. Then, the unstirred suspension was kept for another hour, and the supernatant carefully removed.

After the last washing step with Butylcellosolve™, the sediment was centrifuged, in a centrifugal decanter from Rousselet Robatel (France) at 3000 rpm during 0.5 hour. This resulted in the silver paste SP-01, containing ±70 wt % of silver.

Example 2

Preparation of the Silver Ink SI-01

In a reactor vessel, a mixture of 12.71 g of Klucel J™, 1.52 of a mixture Butylcellosolve™/Dowanol PM™ (90/10), 0.21 g of Dapro DF 6800 and 2.02 g of diethyleneglycol was stirred during 25 minutes.

Then, 1.23 of Disperbyk 2025 was added to the mixture while stirring.

82.3 g of the silver paste SP-01 was then added, and the resulting mixture was stirred for another hour.

Example 3

Preparation of the Silver Pasta SP-02 to SP-13

The silver pastes SP-02 to SP-13 were prepared as SP-01, but with the acids and/or solvents shown in Table 1. The conductivity of all silver pastes, expressed as Ag bulk %, was measured as described above. These conductivities are also shown in Table 1.

TABLE 1

| | Silver Pasta | Carboxylic acid | solvent | Ag bulk % |
|---|---|---|---|---|
| INV-01 | SP-01 | $CH_3-(CH_2)_3-COOH$ | 2-pyrrolidone | 55 |
| INV-02 | SP-02 | $CH_3-(CH_2)_4-COOH$ | 2-pyrrolidone | 34 |
| INV-03 | SP-03 | $CH_3-(CH_2)_5-COOH$ | 2-pyrrolidone | 52 |
| INV-04 | SP-04 | $CH_3-(CH_2)_5-COOH$ | δ-valerolactam | 48 |
| INV-05 | SP-05 | $CH_3-(CH_2)_5-COOH$ | ε-caprolactam | 35 |
| COMP-01 | SP-06 | $CH_3-(CH_2)_5-COOH$ | MOP | 5 |
| COMP-02 | SP-07 | $CH_3-(CH_2)_5-COOH$ | DMA | 0 |
| COMP-03 | SP-08 | $CH_3-(CH_2)_5-COOH$ | NMP | 7 |
| COMP-04 | SP-09 | $CH_3-(CH_2)_5-COOH$ | THF | 0 |

It is clear from Table 1 that the conductivity of the silver pastes prepared with pentanoic acid, hexanoic acid or heptanoic acid, in combination with 2-pyrrolidone, δ-valerolactam or ε-caprolactam are much higher compared with the other silver pastes wherein another solvent is used.

Example 3

In this example, different carboxylic acids are used, all in combination with 2 pyrrolidone.

The pastes were made as described in Example 1 for SP-01, using the acids shown in Table 2. The ratio molar ratio silver/acid was however 2 for de dicarboxylic acids (SP-20 to SP-24), instead of 4 for the monocarboxylic acids (SP-10 to SP-19). For SP-17, SP-18 and SP-19, the concentration of the carboxylic acid was lowered (molar ratio silver/acid was 1 instead of 4 for other pastes) to avoid a too high viscosity of the dispersion during preparation. Moreover, the temperature of the reaction mixture was increased for SP-18 and SP-19 from 25° C. to respectively 50 and 65° C. The conductivities were measured as described above (Table 2).

TABLE 2

| | Silver Paste | Carboxylic acid | solvent | [Ag] wt % | Ag bulk % |
|---|---|---|---|---|---|
| COMP-05 | SP-10 | $CH_3-COOH$ | 2-Py | 37.3 | 0 |
| INV-06 | SP-11 | $CH_3-CH_2-COOH$ | 2-Py | 39.2 | 46 |
| INV-07 | SP-12 | $CH_3-(CH_2)_2-COOH$ | 2-Py | 38.1 | 40 |
| INV-08 | SP-13 | $CH_3-(CH_2)_3-COOH$ | 2-Py | NA* | 55 |
| INV-09 | SP-14 | $CH_3-(CH_2)_4-COOH$ | 2-Py | NA | 34 |
| INV-10 | SP-15 | $CH_3-(CH_2)_5-COOH$ | 2-Py | NA | 43 |
| INV-11 | SP-16 | $CH_3-(CH_2)_6-COOH$ | 2-Py | NA | 16 |
| COMP-06 | SP-17 | $CH_3-(CH_2)_8-COOH$ | 2-Py | 53.5 | 0 |
| COMP-07 | SP-18 | $CH_3-(CH_2)_{14}-COOH$ | 2-Py | 43.1 | 0 |
| COMP-08 | SP-19 | $CH_3-(CH_2)_{18}-COOH$ | 2-Py | 32.4 | 0 |
| COMP-09 | SP-20 | $HOOC-COOH$ | 2-Py | NA | 0 |
| COMP-10 | SP-21 | $HOOC-CH_2-COOH$ | 2-Py | NA | 0 |
| COMP-11 | SP-22 | $HOOC-(CH_2)_3-COOH$ | 2-Py | NA | 2 |
| COMP-12 | SP-23 | $HOOC-(CH_2)_4-COOH$ | 2-Py | NA | 0 |
| COMP-13 | SP-24 | $HOOC-(CH_2)_6-COOH$ | 2-Py | NA | 0 |

*Not Available

It is clear from Table 2 that the silver pastes prepared with propionic, butanoic, pentanoic, hexanoic, heptanoic or octanoic acid have a much higher conductivity compared with the pastes prepared with other carboxylic acids.

Example 4

In this example, different co-solvents, always in combination with 2 pyrrolidone, have been tested. The dispersions were made as described in Example 1, the solvents used are listen in Table 3. The conductivities are measured as described above (Table 3).

TABLE 3

| | | Carboxylic acid | solvent | Ag bulk % |
|---|---|---|---|---|
| INV-12 | SP-25 | $CH_3-(CH_2)_5-COOH$ | 2-Py/MEK 1/1 | 36 |
| INV-13 | SP-26 | $CH_3-(CH_2)_5-COOH$ | 2-Py/IPA 1/1 | 37 |
| INV-14 | SP-27 | $CH_3-(CH_2)_5-COOH$ | 2-Py/Aceton 1/1 | 39 |
| INV-15 | SP-28 | $CH_3-(CH_2)_5-COOH$ | 2-Py/EtOAc 1/1 | 16 |
| INV-16 | SP-29 | $CH_3-(CH_2)_5-COOH$ | 2-Py/cyclohex 1/1 | 17 |
| INV-17 | SP-30 | $CH_3-(CH_2)_5-COOH$ | 2-Py/AcOH 1/1 | 37 |
| INV-18 | SP-31 | $CH_3-(CH_2)_5-COOH$ | 2-Py/AcOH 50/50 | 14 |

TABLE 3-continued

|  |  | Carboxylic acid | solvent | Ag bulk % |
|---|---|---|---|---|
| INV-19 | SP-32 | CH$_3$—(CH$_2$)$_5$—COOH | 2-Py/H$_2$O 95/5 | 16 |
| INV-20 | SP-33 | CH$_3$—(CH$_2$)$_5$—COOH | 2-Py/H$_2$O 90/10 | 35 |
| INV-21 | SP-34 | CH$_3$—(CH$_2$)$_5$—COOH | 2-Py/H$_2$O 85/15 | 42 |
| INV-22 | SP-35 | CH$_3$—(CH$_2$)$_5$—COOH | 2-Py/H$_2$O 80/20 | 40 |
| INV-23 | SP-36 | CH$_3$—(CH$_2$)$_5$—COOH | 2-Py/AcOH 50/50 | 40 |
| INV-24 | SP-37 | CH$_3$—(CH$_2$)$_5$—COOH | 2-Py/AcOH 75/25 | 22 |
| INV-25 | SP-38 | CH$_3$—(CH$_2$)$_5$—COOH | 2-Py/AcOH 25/75 | 54 |

It is clear from Table 3 that a mixture of solvents may be used in a method of the present invention, as long that 2-pyrrolidone is present.

Example 5

In this example, a metallic nanoparticle dispersion has been prepared according to the method as disclosed in U.S. Pat. No. 7,931,941 (see back ground art).
Preparation of the Silver Paste SP-39

A first solution was prepared by adding 50 g of H$_2$O, 2.1 g of NH$_4$OH (30 wt % NH$_3$), 7.8 g of heptanoic acid and 3 g of a 50 wt % aqueous solution of hydrazine.

A second solution was prepared by adding 10 g of AgNO$_3$ to 34.3 g of water.

The second solution was added to the first one while stirring under nitrogen. The resultant product was flocculated and allowed to settle. The excess water was decanted off. A hard silver paste was obtained.

Because it was not possible to coat the silver paste as such, 10 g of the paste was mixed with 0.23 g of NH$_4$OH (25 wt % NH$_3$) to obtain a coatable silver paste. The paste was coated on a subbed polyester with a wet coating thickness of 20μ.

Preparation of the Silver Paste SP-40

A first solution was prepared by adding 150 g of H$_2$O, 7.56 g of NH$_4$OH (25 wt % NH$_3$), 23.4 g of octanoic acid and 7.03 g of a 65 wt % aqueous solution of hydrazine.

A second solution was prepared by adding 53.91 g of a 6 N solution of AgNO$_3$ aqueous solution (6 M) to 103 g of water.

The second solution was added to the first one while stirring under nitrogen. The resultant product was flocculated and allowed to settle. The excess water was decanted off. A hard silver paste was obtained.

Because it was not possible to coat the silver paste as such, 10 g of the paste was mixed with 0.23 g of NH$_4$OH (25 wt % NH$_3$) to obtain a coatable silver paste. The paste was coated on a subbed polyester with a wet coating thickness of 20μ.

The conductivity of the silver coatings were measured as described above, the results are shown in Table 4.

TABLE 4

|  |  | Carboxylic acid | solvent | Ag bulk % |
|---|---|---|---|---|
| COMP-14 | SP-39 | CH$_3$—(CH$_2$)$_5$—COOH | H$_2$O | <0.5* |
| COMP-15 | SP-40 | CH$_3$—(CH$_2$)$_6$—COOH | H$_2$O | <0.5** |
| COMP-16 | SP-40 | CH$_3$—(CH$_2$)$_6$—COOH | H$_2$O | <0.5*** |

*curing at 140° C. during 10 minutes
**curing at 140° C. during 10 minutes
***curing at 140° C. during 40 minutes The silver pastes obtained with the method disclosed in U.S. Pat. No. 7,931,94 are very difficult to coat or print with, because the silver paste obtained was very hard. Moreover, the silver coatings obtained with the silver pastes had a very low conductivity.

The invention claimed is:

1. A method for preparing a metallic nanoparticle dispersion, the method comprising the steps of:
   forming a metallic precursor dispersion or solution by adding a metallic precursor to a dispersion medium including:
   (a) a solvent according to Formula I:

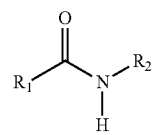

Formula I wherein
   R$^1$ and R$^2$ represent an optionally substituted alkyl group; and
   R$^1$ and R$^2$ may form a ring;
   (b) a carboxylic acid according to Formula II:

Formula II wherein
   R is an optionally substituted C$_2$-C$_7$ alkyl, alkenyl, or alkynyl group;
   reducing the metallic precursor with a reducing agent to form metallic nanoparticles; and
   sedimenting the metallic nanoparticles to obtain a concentrated metallic nanoparticle dispersion including at least 15 wt % of metallic nanoparticles.

2. The method according to claim 1, wherein the dispersion medium includes a solvent according to Formula III:

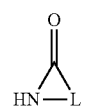

Formula III wherein
   L is an optionally substituted linear or branched C$_2$-C$_{11}$ alkylene group.

3. The method according to claim 2, wherein L in Formula III is an optionally substituted C$_3$-C$_5$ alkylene group.

4. The method according to claim 1, wherein the solvent according to Formula I is selected from 2-pyrrolidone, 4-hydroxy-2-pyrrolidone, δ-valerolactam, and ε-caprolactam.

5. The method according to claim 1, wherein R in Formula II is a C4-C6 n-alkyl group.

6. The method according to claim 4, wherein R in Formula II is a C4-C6 n-alkyl group.

7. The method according to claim 1, wherein the metallic precursor particles are silver oxide particles.

8. The method according to claim 4, wherein the metallic precursor particles are silver oxide particles.

9. The method according to claim 6, wherein the metallic precursor particles are silver oxide particles.

10. The method according to claim 1, wherein the reducing agent is a hydroxylamine or a derivative thereof.

11. The method according to claim 1, further comprising, after the sedimentation step, the step of:

washing the concentrated metallic nanoparticle dispersion.

12. A method for preparing a coating or a printing fluid, the method comprising the step of:
mixing the concentrated metallic nanoparticle dispersion including at least 15 wt % of metallic nanoparticles prepared by the method of claim 1 with additives.

13. The method for preparing a coating or a printing fluid according to claim 12, wherein the additives are selected from a group consisting of a thickening agent, a high boiling solvent, and a wetting agent.

14. The method for preparing a coating or a printing fluid according to claim 13, wherein the thickening agent is a cellulose derivative.

15. The method for preparing a coating or a printing fluid according to claim 14, wherein the thickening agent is hydroxypropylcellulose.

16. The method for preparing a coating or a printing fluid according to claim 13, wherein the high boiling solvent is selected from diethyleneglycol, 1-methoxy-2-propanol, and 2-butoxyethanol.

17. A method for preparing a metallic layer or a pattern, the method comprising the step of:
applying a printing or a coating fluid prepared by the method of claim 12 on a substrate; and
sintering the substrate.

18. The method for preparing a metallic layer or a pattern according to claim 17, wherein the sintering step is carried out at a temperature of 150° C. or less.

* * * * *